United States Patent
Krishnan et al.

(10) Patent No.: US 7,279,966 B2
(45) Date of Patent: Oct. 9, 2007

(54) SYSTEMS FOR PSEUDO-BD MODULATION

(75) Inventors: Jagadeesh Krishnan, Dallas, TX (US); Srinath Mathur Ramaswamy, Dallas, TX (US); Gangadhar Burra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 144 days.

(21) Appl. No.: 11/193,871

(22) Filed: Jul. 29, 2005

(65) Prior Publication Data

US 2007/0024361 A1 Feb. 1, 2007

(51) Int. Cl.
*H03F 3/38* (2006.01)
(52) U.S. Cl. .......................................... 330/10; 330/251
(58) Field of Classification Search .................. 330/10, 330/251, 207 A
See application file for complete search history.

(56) References Cited

U.S. PATENT DOCUMENTS

| 6,097,249 | A | 8/2000 | Strickland et al. |
| 6,819,177 | B2 | 11/2004 | Ruha et al. |
| 7,132,884 | B2 * | 11/2006 | Ohkuri et al. ................. 330/10 |
| 7,135,922 | B2 * | 11/2006 | Zepp ........................... 330/251 |
| 7,142,051 | B2 * | 11/2006 | Sawashi ....................... 330/10 |

* cited by examiner

*Primary Examiner*—Henry Choe
(74) *Attorney, Agent, or Firm*—William B Kempler; W. James Brady, III; Frederick J. Telecky, Jr.

(57) ABSTRACT

An amplifier system in accordance with an aspect of the present invention comprises a switching amplifier that drives a load with a pulse-width modulated (PWM) output signal that varies between first and second rails based on a first control input signal, and a common mode supply that provides a switching signal that varies between third and fourth rails to maintain a common mode voltage of the load at a level that is between the first and second rails.

23 Claims, 4 Drawing Sheets

SYSTEMS FOR PSEUDO-BD MODULATION

TECHNICAL FIELD

The present invention relates to electronic circuits, and more specifically, to systems for providing pseudo-BD modulation.

BACKGROUND

Switching amplifiers are utilized in a variety of different technologies, including motor control, switching radio frequency (RF) power amplifiers as well as audio amplifiers. The output power provided to a load is controlled by switching power switches (e.g., transistors) in the output stage of the amplifier. The output stage of the switching amplifier can be implemented as a half-bridge or a full H-bridge, such as by employing an arrangement of power transistors. The load of a switching amplifier, for example, can be a circuit containing an inductive component, such as a motor or a speaker.

Class D amplifiers employ pulse width modulation techniques to convert input signals to pulse trains, which are then used to recover input signal information from amplified pulse trains. One type modulation scheme that can be implemented by a switching amplifier is Class AD operation in which the output is modulated between two states (e.g., a high level and a low level) at a variable rate according to an input signal. Class D amplifiers can theoretically achieve a high efficiency (e.g., about 100%) implementing AD operation, assuming the use of 'ideal' components. A high level of output ripple voltage, however, can exist at low signal levels. For example, traditional Class D amplifiers, implementing Class AD operation, typically require large AC coupling capacitors to drive single ended loads. In addition to adding significant cost to the amplifier structure, the large capacitors can cause power limitations at upper audio frequencies. The two-state AD operation also yields lower efficiency than BD operation because of strong circulating currents that tend to occur in the case of AD operation.

Another type of switching amplifier system implements class BD operation, which was devised to overcome some of the deficiencies of Class AD operation. A Class BD amplifier generates sets of variable-width pulse trains of either positive or negative polarity at an instant signal condition. The generated signal returns to zero volts between pulses. The three-state operation is known as Class BD operation because pulses of only one polarity actually "carry" the signal at a given signal polarity, and the output is similar to the operation of a traditional Class B power amplifier.

Improved systems and methods for implementing amplifiers are desired to achieve efficient operation and low distortion at the output.

SUMMARY

The present invention relates generally to systems and methods for pseudo-BD modulation. One aspect of the present invention provides an amplifier system that includes a switching amplifier that drives a load with a pulse-width modulated (PWM) output signal that varies between first and second rails based on a first control input signal, and a common mode supply that provides a switching signal that varies between third and fourth rails to maintain a common mode of the load at a level that is between the first and second rails.

An audio amplifier system, in accordance with another aspect of the present invention, includes a Class-D amplifier that provides a first switching signal at a first output for driving a load, the first switching signal being modulated between first and second voltage rails and having a duty cycle that varies based on an input control signal that represents an input audio signal, and a common mode supply that provides a second switching signal at a second output for establishing a common voltage at the load, the second switching signal being modulated between the first and second rails and having a substantially fixed duty cycle.

An amplifier system, in accordance with still another aspect of the present invention, includes means for providing a first switching signal at a first output for driving a load, the first switching signal being modulated between first and second rails and having a duty cycle that varies based on an input control signal. The amplifier system also includes means for providing a second switching signal at a second output, the second switching signal being modulated between the first and second rails and having a substantially fixed duty cycle so as to establish and maintain a common mode voltage for the load at a level that is between the first and second rails.

DETAILED DESCRIPTION

The present invention relates to systems and methods that can achieve pseudo-BD modulation. The systems and methods can achieve pseudo-BD modulation by providing a switching signal to a load to establish a common mode voltage for the load concurrently with a pulse-width modulated (PWM) signal. For example, a switching amplifier (e.g., a Class D amplifier) can provide a first switching output signal to a load while a second switching signal is also provided to the load to establish a corresponding common mode voltage for the first output signal. The first switching signal can be modulated between high and low voltage rails with a pulse width that varies according to an input signal. The second switching signal can be provided at substantially fixed duty cycle (e.g., about 50%) and modulated between the same high and low rails as the first switching signal. As described herein, pseudo-BD modulation corresponds to the aggregate signal at the load resulting from the first and second switching signals. It is to be appreciated that the common mode voltage of the pseudo-BD modulated signal can be set at the midpoint of the high and low rails of the first switching signal by appropriately controlling the second switching signal, such as by controlling the duty cycle accordingly. Those skilled in the art will appreciate various approaches that can be employed to provide the switching signal based on the teachings contained herein.

By employing such a modulation scheme, AC coupling capacitors can be eliminated from a load. Such AC coupling capacitors are typically employed at a load (e.g., a speaker) of an audio system. For instance, large AC coupling capacitors are ordinarily implemented to provide single ended loads in audio systems with a common mode output.

Figure 1:
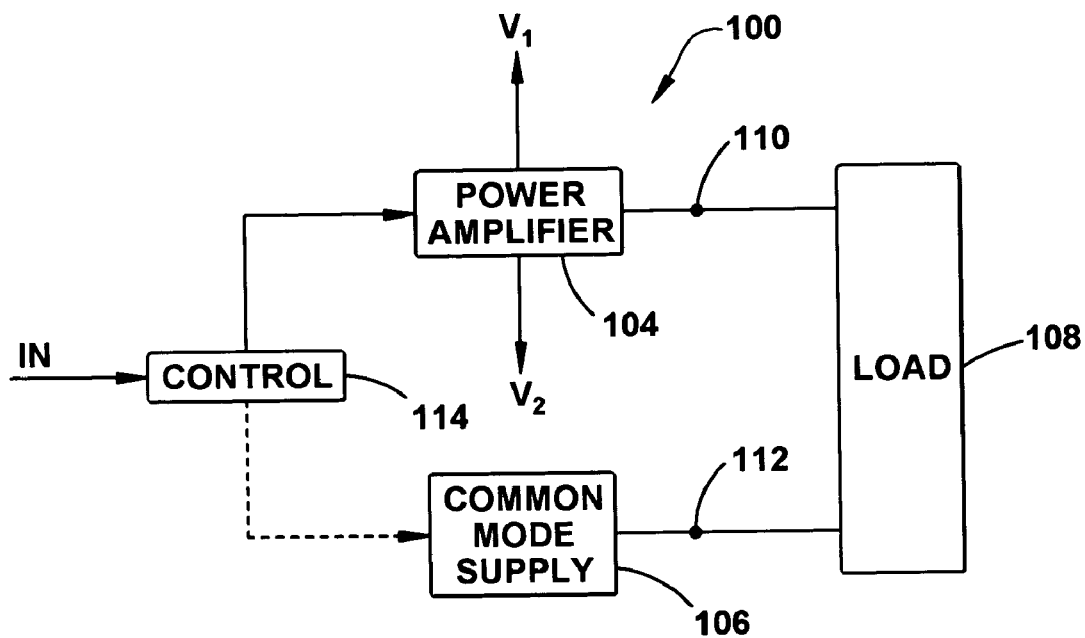
FIG. 1 illustrates a block diagram of an amplifier system in accordance with an aspect of the invention.

FIG. 1 illustrates an amplifier system 100 that can be implemented in accordance with an aspect of the present invention. As described herein, the amplifier system 100 is configured to implement a pseudo-BD modulation that eliminates the need for a large coupling capacitor associated with an associated load 108. The system 100 includes a power amplifier 104 that provides a first switching signal to the load 108.

The load 108 is connected between a power amplifier 104 a common mode supply 106. For example, the load 108 can be one or more speakers that can be driven by the amplifier system 100 as part of a larger audio system. In this example, the load 108 is arranged as a single ended load that is driven by the power amplifier 104 and the common mode supply 106. It is to be understood that the amplifier system 100 can be used with other output configurations.

The power amplifier 104 can be configured as a switching amplifier, for example, a class D switching amplifier. The amplified output signal can be, for example, a PWM signal (e.g., an audio signal modulated to provide corresponding audio content to a speaker). The first switching signal at 110 can be modulated between a high voltage rail $V_1$ and a low voltage rail $V_2$, wherein $V_1 > V_2$. The first switching signal can be a PWM signal having a substantially fixed frequency ($f_c$) with a pulse width or duty cycle that varies according to a control signal. According to an aspect of the present invention, an output stage of the power amplifier 104 can be connected directly between the rails $V_1$ and $V_2$. By way of example, $V_1$ and $V_2$ can be unregulated voltages, such as $V_1$ being a battery voltage and $V_2$ being electrical ground or other lower potential.

The common mode supply 106 provides a common mode output signal at an output 112 that is connected to the load 108. According to an aspect of the present invention, the output signal at 112 is a second switching signal having a DC component that sets a common mode voltage at a desired level. For example, the common mode supply 106 can be implemented as a square wave generator that provides the common mode output as a substantially square wave with a carrier frequency substantially equal to the frequency ($f_c$) of the first switching signal provided at 110. Alternatively, the common mode supply 106 can be implemented as a switching amplifier, which can be the same or different from the power amplifier 104. In this example, the second switching output signal at 112 can be a PWM signal having a duty cycle (e.g., about 50%) and a frequency that is substantially the same as frequency ($f_c$) of the first switching signal provided at 110. The second switching signal provided at 112 further can be modulated between the same voltage rails, $V_1$ and $V_2$, as the first switching signal, such that the common mode voltage is maintained at a level that is intermediate $V_1$ and $V_2$. In the present example, the common mode voltage can be substantially equal to about $(V_1-V_2)/2+V_1$.

Those skilled in the art will understand and appreciate various other circuits and systems that can be employed to generate the second switching signal at 112 according to an aspect of the present invention. By establishing the common mode voltage at 112 for the load 108, as described herein, a pseudo-BD modulation of the load 108 can be achieved according to an aspect of the present invention. Pseudo-BD modulation entails a modulating between two predetermined voltages (e.g., $V_1$ and $V_2$), while a common voltage is maintained at a level that is intermediate the two predetermined voltages (e.g., $V_1$ and $V_2$) by supplying the second switching signal. By establishing the common mode voltage, the need for other circuit components (e.g., an AC coupling capacitor) between the power amplifier 104 and the common mode supply 106 can be reduced or eliminated.

A controller 114 can be programmed and/or configured to provide a control signal to control the power amplifier 104 to achieve desired modulation of the first switching signal that is provided at the output 110. The controller 114 controls the power amplifier 104 in response to an input signal (IN) that requires the power amplifier 104 to be activated (e.g., from a non-switching mode to a switching mode or normal mode). The input signal can represent, for example, an audio signal. When in the normal operating mode, the power amplifier 104 modulates the first switching signal with a pulse width that varies (e.g., between $V_1$ and $V_2$) according to the control signal, which further varies according to the IN signal.

The controller 114 can also be programmed and/or configured to provide a second control signal to the common mode supply 106 to provide the common mode output to the load 108. The second control signal, for example, can be an enable signal that activates the common mode supply. Alternatively or additionally, the second control signal can control the duty cycle and/or frequency of the second switching signal provided by the common mode supply 106. The controller 114 can activate the common mode supply 106 concurrently with the power amplifier 104 to achieve desired pseudo-BD operation. When the common mode supply 106 is activated, the common mode output provided to the node 110 substantially matches the voltage at node 112.

During normal operation of the amplifier system 100, both the power amplifier 104 and common mode supply 106 are activated and can continue to operate concurrently until the input (IN) signal received by the controller 114 indicates a change in state of the power amplifier 104 (e.g., to a non-switching or off mode). When such a signal is received, both the power amplifier 104 and the common mode supply 106 can be deactivated.

Figure 2:
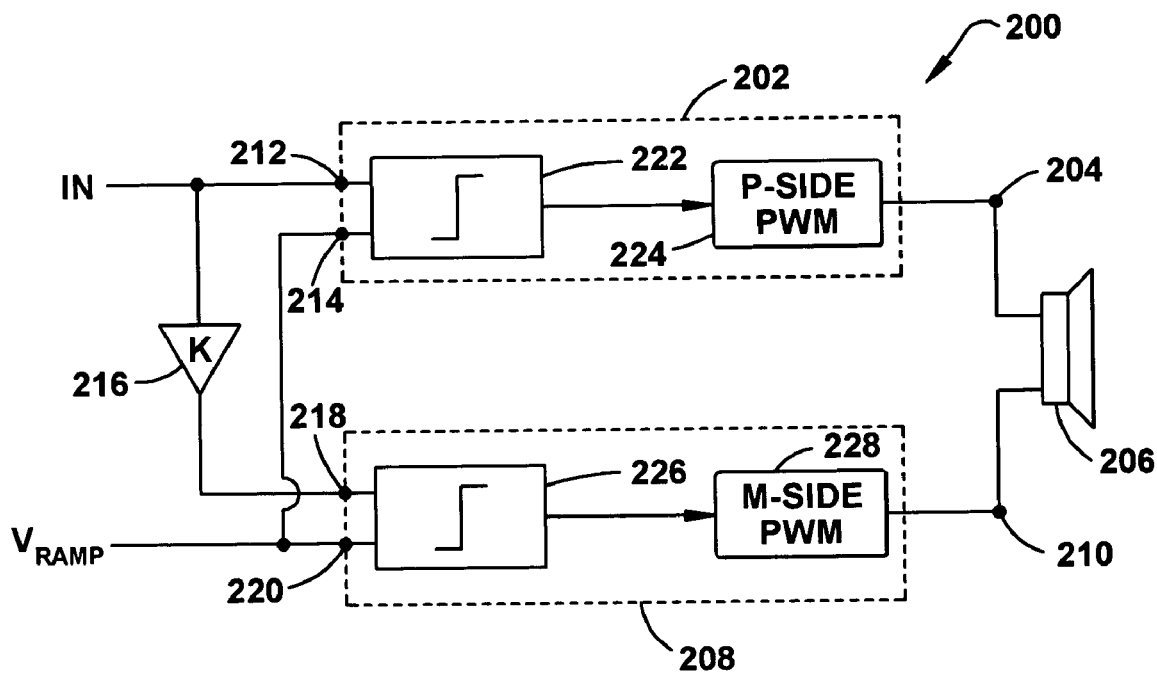
FIG. 2 illustrates another example of an amplifier system in accordance with an aspect of the invention.

FIG. 2. illustrates another example of an amplifier system 200 that can be implemented in accordance with an aspect of the present invention. The amplifier system 200 of FIG. 2 corresponds to part of an audio system. A power amplifier 202 provides an amplified output signal to a positive or plus node (P-Side) 204 of a speaker 206. A common mode supply 208 provides a common mode output to the negative, or minus node 210 (M-Side) of the speaker 206. In this example, the speaker 206 is arranged as a singled ended load. An input signal (IN) is provided to one input terminal 212 of the power amplifier 202. A ramp signal, such as a triangle wave ($V_{Ramp}$) is provided into a second input terminal 214 of the power amplifier 202.

The power amplifier 202 is implemented as a switching amplifier that includes a first comparator 222 and a P-Side PWM block 224. The first comparator 222 receives the input signal at a first input terminal 212, and the $V_{Ramp}$ at a second input terminal 214. The first comparator 222 provides a comparator output signal to the P-Side PWM block 224. That is, the comparator output signal modulates between associated voltage rails to provide a PWM control input signal to the P-side PWM block 224. The pulse-width modulator 224 can include, for example, a half-bridge amplifier. The P-Side pulse-width modulator 224 provides the PWM output signal at the P-Side 204 for driving the speaker 206 accordingly.

The common mode supply 208 is implemented as a second switching amplifier, which can be substantially similar in configuration to the power amplifier 202. The common mode supply 208 includes a second comparator 226 and an M-Side PWM block 228. A fixed DC input is provided to a first input terminal 218 of the second comparator 226 of the common mode supply 208. $V_{Ramp}$ is provided to a second input terminal 220 of the second comparator 226. As one example, the second comparator 226 receives an appropriate DC voltage, such as 0 V DC, from a buffer 216 at the second comparator's first input terminal 218 to implement pseudo-BD modulation. Alternatively, the second comparator could receive 0 V DC from any appropriate electrically neutral source (e.g., electrical ground). The second comparator 226 provides a PWM output signal with a substantially fixed duty cycle (e.g., about 50%) to the M-Side PWM block 228. The M-Side PWM block 228 can include, for example, a half-bridge amplifier. The M-Side pulse-width modulator 228 provides the PWM output signal to establish a common mode voltage across the speaker 206, which can be any desired voltage between the high and low voltage rails of the output stage of the P-side PWM block (e.g., a mid-point voltage).

Figure 3:
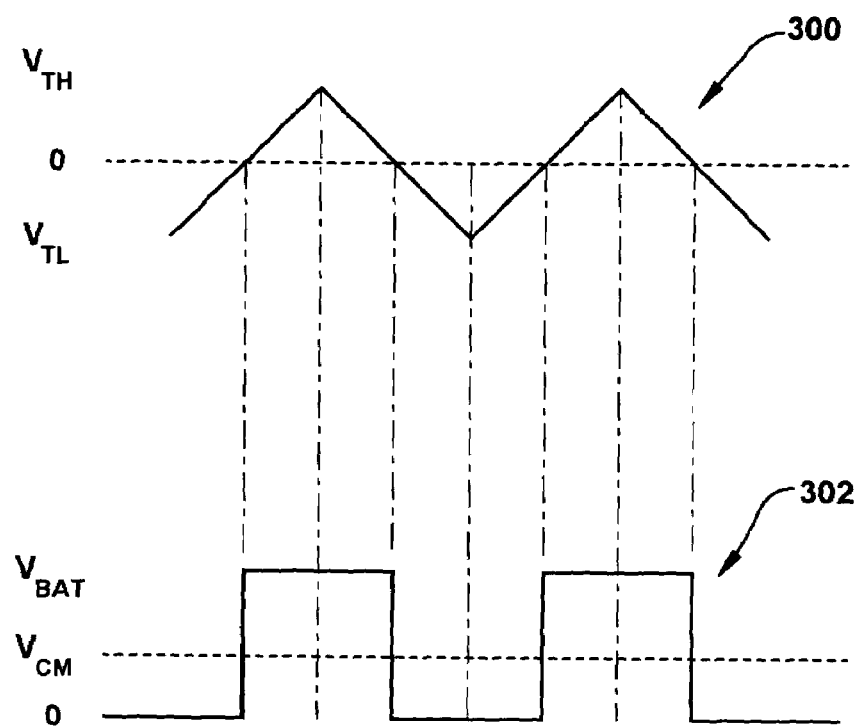
FIG. 3 illustrates a pulse-width modulated signal that can be generated in accordance with an aspect of the invention.

FIG. 3 illustrates an example of $V_{Ramp}$ 300 and the common mode output 302 that could be implemented in the example illustrated in FIG. 2. In the example of FIG. 3, $V_{Ramp}$ 300 oscillates between a low voltage ($V_{TL}$) and a high voltage ($V_{TH}$), wherein $V_{TH}>0>V_{TL}$. The common mode output ($V_{CM}$) 302 is a square wave (e.g., 50% duty cycle PWM), which can be provided by comparing $V_{Ramp}$ relative to a input signal that is intermediate $V_{TH}$ and $V_{TL}$ (e.g., 0 V). $V_{CM}$ oscillates between '0' and $V_{BAT}$ at a substantially fixed duty cycle, such as about 50%. Thus, the common mode output 302 achieves a common mode voltage of about $V_{BAT}/2$. By way of further example, the input signal in FIG. 2 corresponds to an audio signal. The audio signal is provided to the power amplifier 202, the power amplifier 202 modulates the input signal, and provides the amplified output signal to drive the speaker 206. Concurrently, the common mode supply 208 provides the speaker 206 with the common mode output 302 while the power amplifier 202 provides the amplified output signal to establish a common mode voltage across the speaker 206.

Figure 4:
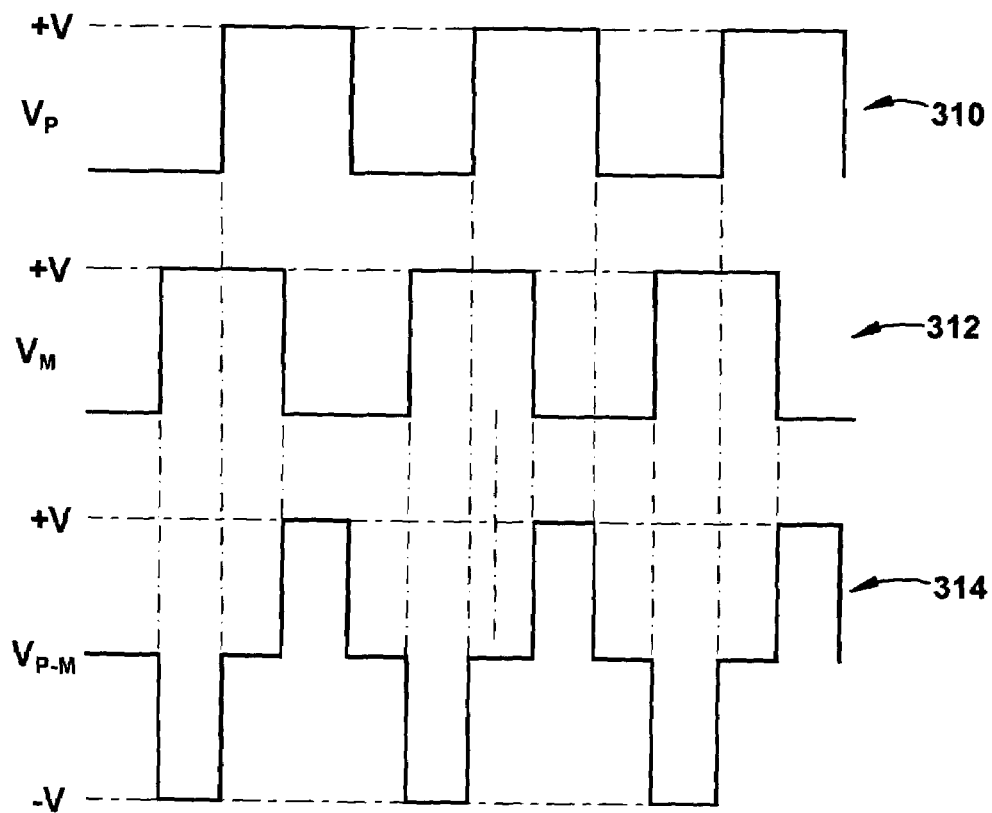
FIG. 4 illustrates an example of waveforms for a pseudo-BD modulation scheme that can be implemented in an amplifier system in accordance with an aspect of the invention.

FIG. 4 depicts examples of waveforms ($V_P$) 310 and ($V_M$) 312 that can be combined to provide a pseudo-BD modulated waveform ($V_{P-M}$) 314 according to an aspect of the present invention. In FIG. 4, the waveform 310 corresponds to a PWM signal, such as can be provided at the plus node 204 (FIG. 2). The PWM signal 310 modulates at a carrier frequency between electrical ground and +V (e.g., $V_{BAT}$) and can have a variable duty cycle. The signal 312 can be provided at the carrier frequency with a substantially fixed duty cycle to set and maintain the common mode, such as mentioned above with respect to FIG. 3. The result of combining the respective signals 310 and 312 across a given load is the pseudo-BD modulated waveform ($V_{P-M}$) 314, which varies between +V and −V and can also maintain a third state corresponding to electrical ground. The duration of the signal 314 at electrical ground is determined by the amount of overlap between the signals 310 and 314.

By way of further example, the following equation depicts the double Fourier series expression for a pseudo-BD modulated output signal that can be provided according an aspect of the present invention:

$$F_{NPDB} = \frac{1}{2}\left[M\cos(y) + 2\sum_{m=1}^{\infty}\frac{J_0\left(m\pi\frac{M}{2}\right)}{\frac{m\pi}{2}}\sin\left(m\frac{\pi}{2}\right)\cos(mx) + \sum_{m=1}^{\infty}\sum_{n=\pm 1}^{\infty}\frac{J_n\left(m\pi\frac{M}{2}\right)}{\frac{m\pi}{2}}\sin(m+n)\cos(mx+ny) - \sum_{m=1}^{\infty}\frac{M}{2}\frac{\sin\left(\frac{m\pi}{2}\right)}{\frac{m\pi}{2}}\right]$$

where:
M is the modulation M is the modulation index (varies between 0 and 1 depending on the amplitude of the PWM input signal);
x=ωct, where ωc is the carrier frequency (in radians);
y=ωt, where ω is the audio signal frequency (in radians);
$J_0$ is the Bessel function of the 0th order;
$J_n$ is the Bessel function of the nth order;
n is the index to the harmonics of the audio signal; and
m is the index to the harmonics of the carrier signal.

Figure 5:
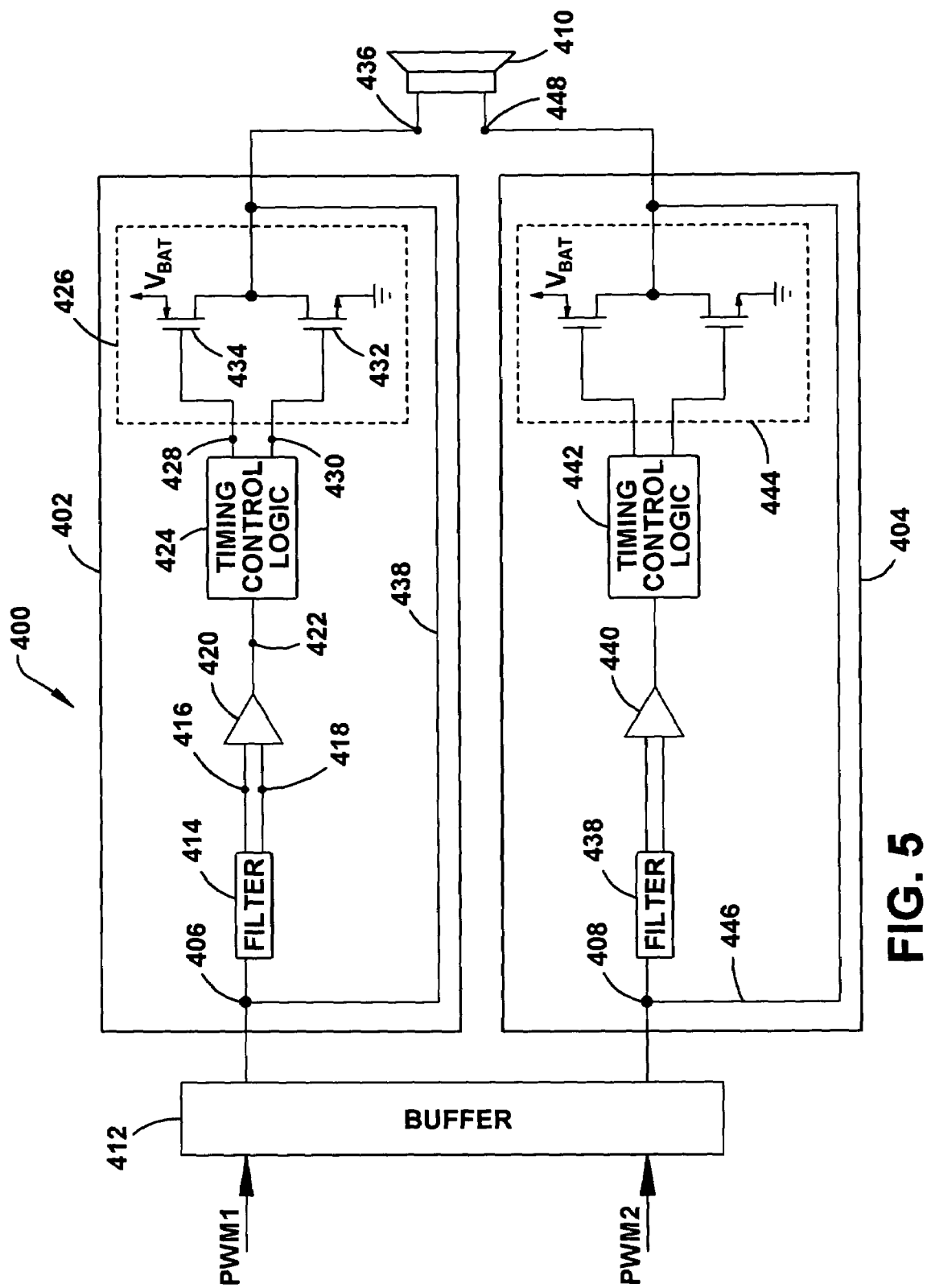
FIG. 5 illustrates yet another example of an amplifier system in accordance with an aspect of the invention.

FIG. 5 illustrates another example of an amplifier system 400 that can be implemented in accordance with an aspect of the present invention. The amplifier system 400 includes a power amplifier 402 and a common mode supply 404, each of which includes a switching amplifier configured according to an aspect of the present invention. For example, the power amplifier 402 and common mode supply 404 can operate independently based on respective PWM input signals (PWM1 and PWM2) provided at the inputs 406 and 408 of the power amplifier 402 and the common mode supply 404, respectively. In this mode, (e.g., a pseudo-BD mode), each of the power amplifier 402 and the common mode supply 404 provides separate switching output signals to drive a load 410 based on the PWM input signals provided at 406 and 408. As in other examples described herein, the load 410 can include one or more speakers, although other types of load can also be driven by the amplifier system 400.

To help isolate a digital PWM processor and other circuitry (not shown) from the amplifier system 400 the PWM input signals can be provided to a buffer 412. The buffer (e.g., a one-bit digital-to-analog converter) 412 can regulate the PWM input signals between high and low voltage rails, at least one of which is being a regulated voltage (e.g., $V_{DD}$) and electrical ground. The buffer 412 thus mitigates voltage ripple and other noise that might otherwise be introduced on to digital PWM input signals. The buffer 412 provides corresponding PWM input signals to respective inputs 406 and 408 of the power amplifier 402 and the common mode supply 404. The buffered inputs at 406 and 408 thus have pulse widths commensurate with PWM1 and PWM2 and alternating between high and low voltage rails (e.g., $V_{DD}$ and electrical ground, respectively).

Each of the power amplifier 402 and the common mode supply 404 can be configured substantially similarly. For purposes of brevity the power amplifier 402 will be described followed by a summary discussion of the common mode supply 404 of the amplifier system 400. The power amplifier 402 includes a loop filter 414 with provides two outputs 416 and 418 as inputs to a comparator 420. For example, the loop filter 414 can be implemented as an Nth order loop filter, where N is a positive integer greater than one (N>1). The loop filter 414 can provide, for instance, a first output at 416 corresponding to a first order integration of the input signal provided at 406. The loop filter can also provide a second output at 418 corresponding to a second integrated output signal, such as by integrating the signal at 416.

The comparator 420 compares the signals at 416 and 418 to provide a corresponding quantized output signal at a comparator output 422. The quantized output signal at 422 is a PWM signal that is provided to a timing control logic block 424. The timing control logic 424, can for example, include a combination of switch devices and logic gates that decode the input PWM signal as well as control the rising-edge and falling-edge dead time of power stage transistors (e.g., power field effect transistors) as well as correct timing asymmetry that other blocks in the PWM signal path might cause. The timing control logic 424 provides one or more timing-compensated signals to control an output stage 426. For example, the timing control logic 424 can include a high-side output 428 and a low side output 430 for controlling the output stage. The output stage can be configured as a half bridge having cascoded transistors 432 and 434 connected between first and second voltage rails. In the example of FIG. 5, the first voltage rail corresponds to an unregulated battery voltage and the second rail corresponds to electrical ground, although other voltages and output stage arrangements could also be utilized.

The output stage 426 provides a PWM signal to a first output 436 that is connected to a first input terminal for driving the speaker 410. The output signal at 436 can, for example, include a PWM signal having an amplitude that varies between two voltage rails, wherein at least at least one voltage rail is an unregulated voltage (e.g., $V_{BAT}$ and electrical ground) according to the frequency and duty cycle indicated by PWM1.

A feedback path at 438 feeds back an indication of the output signal provided at 436 to the input 406 of the loop filter 414. Thus, the signal provided at 406 defines an error signal corresponding to the difference between the buffered input PWM signal (from the buffer 412) and the PWM output at 436. The loop filter 414 is configured to mitigate effects of variations in the unregulated voltage and variations, such as gain, in the transistors 434 and 432.

As stated above, the common mode supply 404 can be configured substantially similarly to the power amplifier 402. Briefly stated, the common mode supply 404 includes a loop filter 438, a comparator 440, a timing control logic block 442, an output stage 444, and a feedback signal at 446. The common mode supply provides a common mode output signal at a second terminal 448 of the speaker 410. The common mode output can be implemented as a PWM signal. The common mode supply 404 is driven by PWM2. PWM2 can be implemented as a PWM signal with a substantially fixed duty cycle (e.g., about 50%) at a frequency substantially equal to the frequency of PWM1.

By implementing each of the power amplifier 402 and the common mode supply 404 as switching amplifiers in the manner stated above, an H-bridge can be employed establish a common mode across the speaker 410. That is, both the power amplifier 402 and the common mode supply 404 are half-bridge amplifiers of the amplifier system 400. The power amplifier 402 will modulate the signal at 436 in response to the PWM1 signal to drive the speaker 410 for providing a corresponding audible signal. Concurrently, the PWM2 signal can activate the common mode supply 404 to provide the common mode output signal at the second output 448 coupled to another input terminal of the speaker 410. When the PWM output signal and the common mode output signal are provided to the speaker 410 concurrently, desired pseudo-BD modulation is achieved. The pseudo-BD modulation establishes a common mode voltage across the speaker 410. The common mode voltage can be the midpoint between $V_{BAT}$ and electrical ground (e.g., $V_{BAT}/2$). By establishing the common voltage across the speaker 410, the need for an AC coupling capacitance associated with speaker 410 can be reduced or eliminated. Further efficiencies can be achieved since, as mentioned above, substantially the same timing can be implemented with respect to each of the power amplifier 402 and the common mode supply 404.

Figure 6:
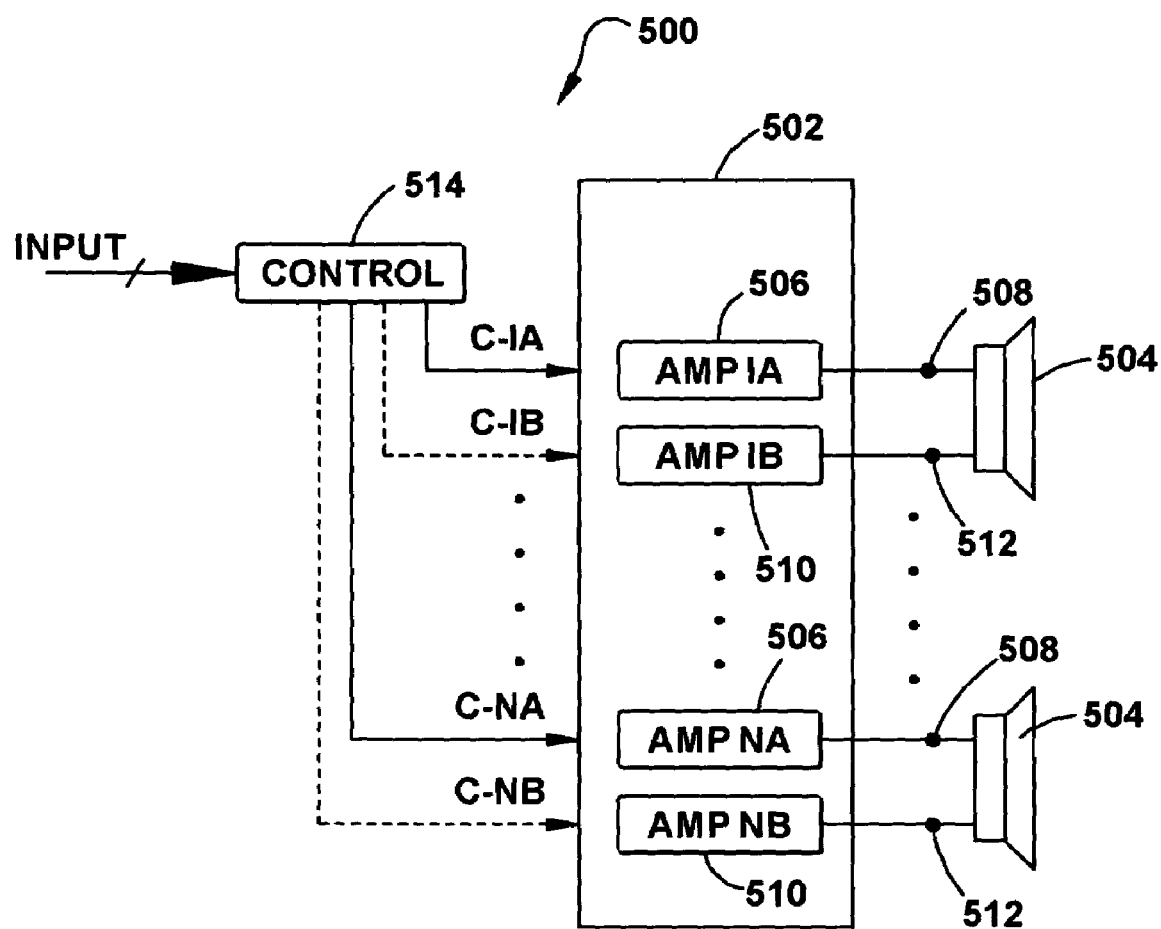
FIG. 6 illustrates still another example of an amplifier system in accordance with an aspect of the invention.

FIG. 6 illustrates an example of part of a multi-channel audio system 500 that can be implemented in accordance with an aspect of this invention. For example, the multi-channel audio system 500 can correspond to a surround sound system. In the example of FIG. 6, the audio system 500 is configured in a multi-channel, single ended load configuration, although other topologies could be used. The example of FIG. 6 can be implemented by the above-mentioned configurations.

The multi-channel audio system 500 includes an amplifier system 502 that is operative to provide multi-channel amplified audio to a plurality of loads 504, namely speakers 504. The amplifier system 502 can be implemented on a single integrated circuit (IC) chip. The amplifier system 502 includes an associated power amplifier 506 represented as AMP 1A through AMP NA, where N is a positive integer greater than 1 denoting the number of audio channels and the designation "A" denotes the amplifier as a power amplifier 506. Each of the power amplifiers 506 provides an amplified audio signal to a first output 508 of each audio channel. The power amplifiers 506 each provides a PWM output that varies between first and second voltage rails (e.g., $V_{BAT}$ and electrical ground) and having a pulse width (or duty cycle) that varies as a function of a respective input signal, indicated at, indicated at C_1A through C_NA.

The amplifier system 502 also includes a common mode supply 510 associated with each audio channel. A separate power amplifier 510, represented as AMP 1B through AMP NB, where the designation "B" denotes the amplifier as a common mode supply, is associated with each audio channel. Thus, each audio channel includes an amplifier pair, including one power amplifier 506 and one common mode supply 510. Each common mode supply 510 is configured to provide a common mode output to a second output 512 of a respective audio channel to maintain a common mode voltage for the associated speaker 504 to which the supply is connected. For instance, each common mode supply can be implemented as a Class-D amplifier that is configured to provide the common mode output signal at 512 as a PWM signal having a substantially fixed duty cycle (e.g., 50%).

A control system 514 can be included to control the amplifier system 502. For example, the control system 514 can control the activation and deactivation of the power amplifiers 506. The control system 514 can also control the activation and deactivation of common mode supplies 510, which control can vary according to the architecture of the common mode supplies 510. As an example, the control system 502 provides control signals C_1A through C_NA for each of the power amplifiers 506, which can vary according to one or more INPUT signals. The control system 514 can optionally provide control signals for each of the common mode supplies 510, indicated at C_1B through C_NB. The control system 502 can be implemented as a PWM processor that is configured to interface with the amplifier system 502 and generates one or more PWM output signal C_1A through C_NA for each of the respective audio channels. The control system 502 can also be optionally designed to generate a second set of PWM signals C_1B through C_NB for each of the respective audio channels.

When the INPUT signal includes an audio signal for a given audio channel, the control system 514 can provide the control signals to one or more of the power amplifiers 506 and optionally to the common mode supply 510 associated with the given audio channel. It is to be understood that the audio signal can vary for a given audio channel depending on, for example, the operating mode (surround sound, signal processing mode, stereo etc.) being implemented. The power amplifier 506 and the common mode supply 510 can be operated concurrently to drive the speaker 504 for the given channel. The concurrent operation of the power amplifier 506 and the common mode supply 510 achieves a desired pseudo-BD modulation, such as described herein. The pseudo-BD modulation establishes a common mode voltage across the associated speaker 504 that is intermediate the voltage rails of an output stage of the power amplifier 506. While each load 504 in FIG. 6 is depicted as being driven by a pair of amplifiers, including an amplifier 506 and a common mode supply 510, it will be understood and appreciated that a single common mode supply 510 can support a plurality of channels by providing a common mode voltage to a plurality of loads (e.g., to speakers in a bridge-tied load arrangement).

Through pseudo-BD modulation, the establishment of the common mode voltage eliminates the need for an AC coupling capacitor associated with each speaker 504. Furthermore, the pseudo-BD modulation can be achieved by employing two half-bridge amplifiers that are commonly found on IC audio chips. Additional efficiencies can be achieved by eliminating the large AC coupling capacitance typically required for Class-AD operation of an audio amplifier. Efficiency also improves significantly relative to Class-AD operation when the amplifier system 502 drives single-ended loads 504.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An amplifier system comprising:
    a switching amplifier configured to drive a first terminal of a single-ended load with a pulse-width modulated (PWM) output signal that varies between first and second rails based on a first control input signal; and
    a common mode supply configured to provide a switching signal that varies between third and fourth rails to maintain a common mode voltage at a second terminal of the load at a level that is between the first and second rails.

2. The amplifier system as claimed in claim 1, wherein the third rail and first rail are the same, and the fourth rail and the second rail are the same.

3. The amplifier system as claimed in claim 1, further comprising a control system that controls at least the switching amplifier so as to provide the PWM output signal to the load at a predetermined carrier frequency.

4. The amplifier system as claimed in claim 3, wherein the common mode supply is configured to provide the switching signal at a carrier frequency substantially equal to the carrier frequency of the PWM output signal.

5. The amplifier system as claimed in claim 1, wherein the load comprises at least one speaker that has the first terminal connected to an output of the switching amplifier and the second terminal connected to an output of the common mode supply.

6. The amplifier system as claimed in claim 1, wherein the amplifier system is implemented in the absence of an AC coupling capacitor connected with the load.

7. The amplifier system as claimed in claim 1, wherein the switching amplifier further comprises a first half-bridge that is connected between the first and second rails and having an output that provides the PWM output signal, and the common mode supply further comprises a second half-bridge connected between the third and fourth rails and having an output that provides the switching signal.

8. The amplifier system as claimed in claim 7, wherein at least the first rail and the third rail are the same and correspond to an unregulated battery voltage.

9. The amplifier system as claimed in claim 7 further comprising:
    a first comparator that provides a first quantized output signal based on a comparison of a ramp signal and a first control input signal, the first half bridge providing the PWM output signal based on the first quantized output signal; and
    a second comparator that provides a second quantized output signal based on a comparison of the ramp signal and a substantially fixed DC signal, the second half bridge providing the switching signal based on the second quantized output signal.

10. The amplifier system as claimed in claim 1, wherein the PWM output signal is a first PWM output signal, the switching signal comprising a PWM signal with a duty cycle of about 50% at a carrier frequency substantially equal to the frequency of the first PWM output signal.

11. The amplifier system as claimed in claim 1, further comprising a plurality of switching amplifier and common mode supply pairs, each switching amplifier and common mode supply pair being associated with a given load, wherein each switching amplifier and common mode supply in each pair provides a PWM output signal and a switching signal, respectively, for the given load, wherein each PWM signal modulates between the first and second rails and has a duty cycle that varies based on a corresponding input signal, and wherein each switching signal modulates between the third and fourth voltage rails with a substantially fixed duty cycle to maintain a common mode voltage for each given load.

12. The amplifier system as claimed in claim 11, wherein each of the given loads comprises at least one speaker that is connected between outputs of a respective switching amplifier and common mode supply pair.

13. The amplifier system as claimed in claim 11, wherein at least the plurality of switching amplifiers and common mode supply pairs are implemented on a single integrated circuit chip.

14. An audio amplifier system, comprising:
    a Class-D amplifier that provides a first switching signal at a first output for driving a first terminal of a single-ended load, the first switching signal being modulated between first and second voltage rails and having a duty cycle that varies based on an input control signal that represents an input audio signal; and
    a common mode supply that provides a second switching signal at a second output for establishing a common voltage at a second terminal of the load, the second switching signal being modulated between the first and second rails and having a substantially fixed duty cycle.

15. The system of claim 14, wherein the first rail comprises an unregulated battery voltage, the Class-D amplifier further comprising a loop filter that filters an error signal corresponding to a difference between the first switching signal at the first output and the input control signal so as to mitigate variations in the unregulated battery voltage.

16. The system of claim 14, further comprising a comparator that provides a second control signal based on a comparison of a ramp signal that modulates between third and fourth voltage rails relative to a substantially fixed DC signal at a level that is between the third and fourth voltage rails, the common mode supply providing the second switching signal based on the second control signal.

17. The system of claim 14, further comprising at least one speaker connected as the load between the first output and the second output.

18. An amplifier system comprising:
    means for providing a first switching signal at a first output for driving a first terminal of a single-ended load, the first switching signal being modulated between first and second rails and having a duty cycle that varies based on an input control signal; and
    means for providing a second switching signal at a second output, the second switching signal being modulated between the first and second rails and having a substantially fixed duty cycle so as to establish and maintain a common mode voltage at a second terminal of the load at a level that is between the first and second rails.

19. The system of claim 18, wherein the means for providing a second switching signal further comprises:
    means for generating a second control signal based on a comparison of a ramp signal and a substantially fixed DC signal, the means providing a second switching signal provides second switching signal based on the second control signal.

20. The system of claim 18, wherein the load further comprises at least one speaker connected between the first output and the second output.

21. An amplifier system comprising:
    a switching amplifier configured to drive a load with a pulse-width modulated (PWM) output signal that varies between first and second rails based on a first control input signal; and
    a common mode supply configured to provide a switching signal that varies between third and fourth rails to maintain a common mode voltage for the load at a level that is between the first and second rails;
    further comprising a plurality of switching amplifier and common mode supply pairs, each switching amplifier and common mode supply pair being associated with a given load, wherein each switching amplifier and common mode supply in each pair provides a PWM output signal and a switching signal, respectively, for the given load, wherein each PWM signal modulates between the first and second rails and has a duty cycle that varies based on a corresponding input signal, and wherein each switching signal modulates between the third and fourth voltage rails with a substantially fixed duty cycle to maintain a common mode voltage for each given load.

22. The amplifier system as claimed in claim 21, wherein each of the given loads comprises at least one speaker that is connected between outputs of a respective switching amplifier and common mode supply pair.

23. The amplifier system as claimed in claim 21, wherein at least the plurality of switching amplifiers and common mode supply pairs are implemented on a single integrated circuit chip.

* * * * *